US008863044B1

(12) United States Patent
Casati et al.

(10) Patent No.: US 8,863,044 B1
(45) Date of Patent: Oct. 14, 2014

(54) LAYOUT ASSESSMENT METHOD AND SYSTEM

(71) Applicant: International Business Machines Corporation, Armonk, NY (US)

(72) Inventors: Nathalie Casati, Zurich (CH); David L. DeMaris, Austin, TX (US); Frank De Morsier, Lausanne (CH); Virginia Estellers Casas, Los Angeles, CA (US); Maria Gabrani, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/020,089

(22) Filed: Sep. 6, 2013

(51) Int. Cl.
*G06F 17/50* (2006.01)

(52) U.S. Cl.
CPC ........ *G06F 17/5081* (2013.01); *G06F 17/5072* (2013.01)
USPC ............... 716/52; 716/53; 716/106; 716/111; 716/112

(58) Field of Classification Search
CPC ............ G06K 2009/4695; G06K 9/00; G06K 9/00281; G06K 9/00369; G06K 9/00597; G06K 9/00664; G06K 9/4604; G06K 9/522; G06K 9/6293; G06F 17/30705; G06F 17/3071; G06F 2216/03; G06F 17/16
USPC ...................................... 716/52, 53, 106–113
See application file for complete search history.

(56) References Cited

U.S. PATENT DOCUMENTS

| | | | |
|---|---|---|---|
| 6,523,162 B1 | 2/2003 | Agrawal et al. | |
| 7,415,695 B2 | 8/2008 | Bergman Reuter et al. | |
| 8,122,407 B2 | 2/2012 | Monkowski | |
| 8,166,423 B2 | 4/2012 | Mansfield et al. | |
| 8,201,132 B2 | 6/2012 | DeMaris et al. | |
| 8,214,787 B1 | 7/2012 | Reis | |
| 8,418,105 B1 | 4/2013 | Wang et al. | |
| 8,429,582 B1 | 4/2013 | Lai et al. | |
| 8,429,588 B2 | 4/2013 | Irmatov et al. | |
| 8,494,305 B2 * | 7/2013 | Porikli et al. | 382/275 |
| 2007/0256037 A1 | 11/2007 | Zavadsky et al. | |
| 2011/0299789 A1* | 12/2011 | Lin et al. | 382/238 |
| 2012/0179634 A1* | 7/2012 | Chen et al. | 706/12 |
| 2012/0251013 A1* | 10/2012 | Porikli | 382/233 |
| 2013/0007676 A1 | 1/2013 | Motiani et al. | |
| 2013/0019221 A1 | 1/2013 | Reis et al. | |
| 2013/0036390 A1 | 2/2013 | Torres Robles et al. | |
| 2013/0132917 A1 | 5/2013 | Simmons | |

OTHER PUBLICATIONS

"Learning a Discriminative Dictionary for Sparse Coding via Label Consistent K-SVD", by Zhuolin Jiang, Zhe Lin, Larry S. Davis, IEEE Conference on Computer Vision and Pattern Recognition, 2011.*

(Continued)

*Primary Examiner* — Nha Nguyen
(74) *Attorney, Agent, or Firm* — David A. Cain; Hoffman Warnick LLC

(57) ABSTRACT

Candidate layout patterns can be assessed using a sparse pattern dictionary of known design layout patterns by determining sparse coefficients for each candidate pattern, reconstructing the respective candidate pattern, and determining reconstruction error. Any pattern with reconstruction error over a threshold value can be flagged. Compressive sampling can be employed, such as by projecting each candidate pattern onto a random line or a random matrix. The dictionary can be built by determining sparse coefficients of known patterns and respective basis function sets using matching pursuit, variants of SVD, and/or other techniques.

19 Claims, 9 Drawing Sheets

(56) References Cited

OTHER PUBLICATIONS

Candes et al., "Sparsity and Incoherence in Compressive Sampling", Nov. 2006.
Candes et al, "An Introduction to Compressive Sampling", IEEE Signal Processing Magazine, Mar. 21, 2008.
Chen et al, "Atomic Decomposition by Basis Pursuit", Department of Operations Research, Stanford University.
Auethavekiat, "Introduction to the Implementation of Compressive Sensing", Au J.T. 14(1): 39-46 (Jul. 2010).
Candes et al, "The Dantzig selector: statistical estimation when p is much larger than n", May 2005.
Xu et al, "Dynamic Texture Reconstruction from Sparse Codes for Unusual Event Detection in Crowded Scenes", Queensland University of Technology, 2011.
Rubinstein et al, "Dictionaries for Sparse Representation Modeling", Proceedings of the IEEE, vol. 98, No. 6, Jun. 2010.
Rubinstein et al, "Double Sparsity: Learning Sparse Dictionaries for Sparse Signal Approximation", IEEE Transactions on Signal Processing, vol. 58, No. 3, Mar. 2010.
Duarte-Carvajalino et al, "Learning to Sense Sparse Signals: Simultaneous Sensing Matrix and Sparsifying Dictionary Optimization", University of Minnesota May 2008.
Rabbat et al, "Decentralized Compression and Predistribution via Randomized Gossiping", IPSN 06, Apr. 19-21, 2006, Nashville, Tennessee.

* cited by examiner

LAYOUT ASSESSMENT METHOD AND SYSTEM

BACKGROUND

The invention relates generally to semiconductor devices and systems for designing and fabricating such devices, particularly to improving device layout and detection of a novel layout, that is, a layout that differs from known layouts.

Due to inherent difficulties in sub-resolution lithography and modeling of resist processes, the risk of patterns which fail (either by short circuits, opens, or parametric failure) is substantially increased compared to the historical record. The standard industry practice of design rules checking (DRC) has become very difficult to implement due to the number and complexity of required rules and strong possibility that they are either too restrictive for efficient design or fail to detect patterns which will fail. In many cases these patterns will be novel (different from what is known), and thus not known to be handled by the existing process stack and/or resolution enhancement techniques, such as optical proximity correction (OPC). One proposed conservative approach to the layout rules problem is to restrict the allowable local patterns to a set which were previously demonstrated to be manufacturable, at least in a given shape context, on a test site or by rigorous simulation. A pattern is defined as a local region or window of layout, with the window size typically matched to an underlying routing or device grid and width up to a typical "optical radius," within which the strongest influence of proximity effects on a layout are contained. Subsequent design layouts U must be scanned and compared with the known pattern library L, which, for a large number of layout patterns, yields a matching or distance operation with a complexity L*U, in a naïve implementation. Hierarchical cluster or tree matching can reduce this, but, especially for automatically routed layout systems with window sizes approaching the optical radius, the number of existing patterns on the new layout U can be quite large. For example, projections of a number of unique patterns based on layout scans of ungridded 22 nanometer data for optical radius sized windows can be as high as 500 million. As a result of these large numbers of patterns and associated computations, processor load for conventional distance-based matching techniques is very high, and might require runtime of distance-based novelty detection on the order of a CPU year.

SUMMARY

Embodiments of the invention disclosed herein can take the form of a semiconductor device design layout assessment method that can determine at least one candidate sparse coefficient for each of at least one candidate pattern and reconstruct each candidate pattern using a sparse pattern dictionary D and the respective at least one candidate sparse coefficient to obtain a reconstructed candidate pattern. The sparse pattern dictionary D can include a respective atom $d_k$ representing at least part of each of at least one compliant pattern known to comply with at least one feasibility parameter. A candidate pattern can be flagged responsive to at least one of a respective candidate reconstruction error $\epsilon_i$ exceeding a predefined maximum candidate reconstruction error value $\epsilon_{i_{max}}$ or a candidate sparse coefficient sparsity s exceeding a predefined sparsity level $s_0$.

Additional embodiments of the invention disclosed herein can take the form of a computer program product stored on a non-transitory computer readable storage medium in the form of computer executable code including instructions that, when executed by a computing device, can configure the computing device to determine at least one candidate sparse coefficient and reconstruct each candidate pattern using a sparse pattern dictionary D and the respective at least one candidate sparse coefficient to obtain a reconstructed candidate pattern. The sparse pattern dictionary D can include at least one respective atom $d_k$ representing at least part of a respective compliant pattern known to comply with at least one feasibility parameter. A candidate reconstruction error between each reconstructed candidate pattern and the respective candidate pattern can be determined, and a candidate pattern can be flagged responsive to at least one of a respective candidate reconstruction error exceeding a predefined maximum candidate reconstruction error value $\epsilon_{i_{max}}$ or a candidate sparse coefficient sparsity s exceeding a predefined sparsity level $s_0$.

Further embodiments of the invention disclosed herein can take the form of a semiconductor device design layout assessment system having a sparse pattern dictionary D including a respective atom $d_k$ that is a respective representation of at least part of at least one compliant layout Y1, each atom $d_k$ including at least one compliant basis function of the respective compliant pattern $y1_i$. A candidate sparse coefficient determination arrangement can be configured to determine a respective at least one candidate sparse coefficient $x_i$ for each of at least one candidate pattern $y2_i$. A candidate pattern reconstructor can be configured to create a reconstructed candidate pattern $Dx_i$ based on the sparse pattern dictionary D and the respective at least one candidate sparse coefficient $x_i$, and a candidate pattern comparator can be configured to determine a respective candidate reconstruction error $\epsilon_i$ between each candidate pattern $y2_i$ and the respective reconstructed candidate pattern $Dx_i$. A pattern flagger configured to flag a candidate pattern responsive to a respective candidate reconstruction error $\epsilon_i = \|y2_i - Dx_i\|_{l_2}$ exceeding a largest learning reconstruction error $\|y1_i - Dx_i\|_{l_2}$ including the relationship $$\epsilon_i > C_{adj} * \max\|y1_i - Dx_i\|_{l_2},$$

where $C_{adj}$ is a predefined adjustment constant whose value determines how different a candidate pattern $y2_i$ has to be from the at least one compliant pattern $y1_i$ to be flagged. Alternatively, the pattern flagger can be configured to flag a candidate pattern responsive to a sparsity s of a reconstructed candidate coefficient vector $x_i^*$ exceeding a predefined sparsity level $s_0$ as determined using the relationship $$x_i^* = \min\|y2_i - Dx_i\|_{l_2} \text{ subject to } \|x_i\|_{l_0} \leq s_0.$$

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings.

Figure 1:
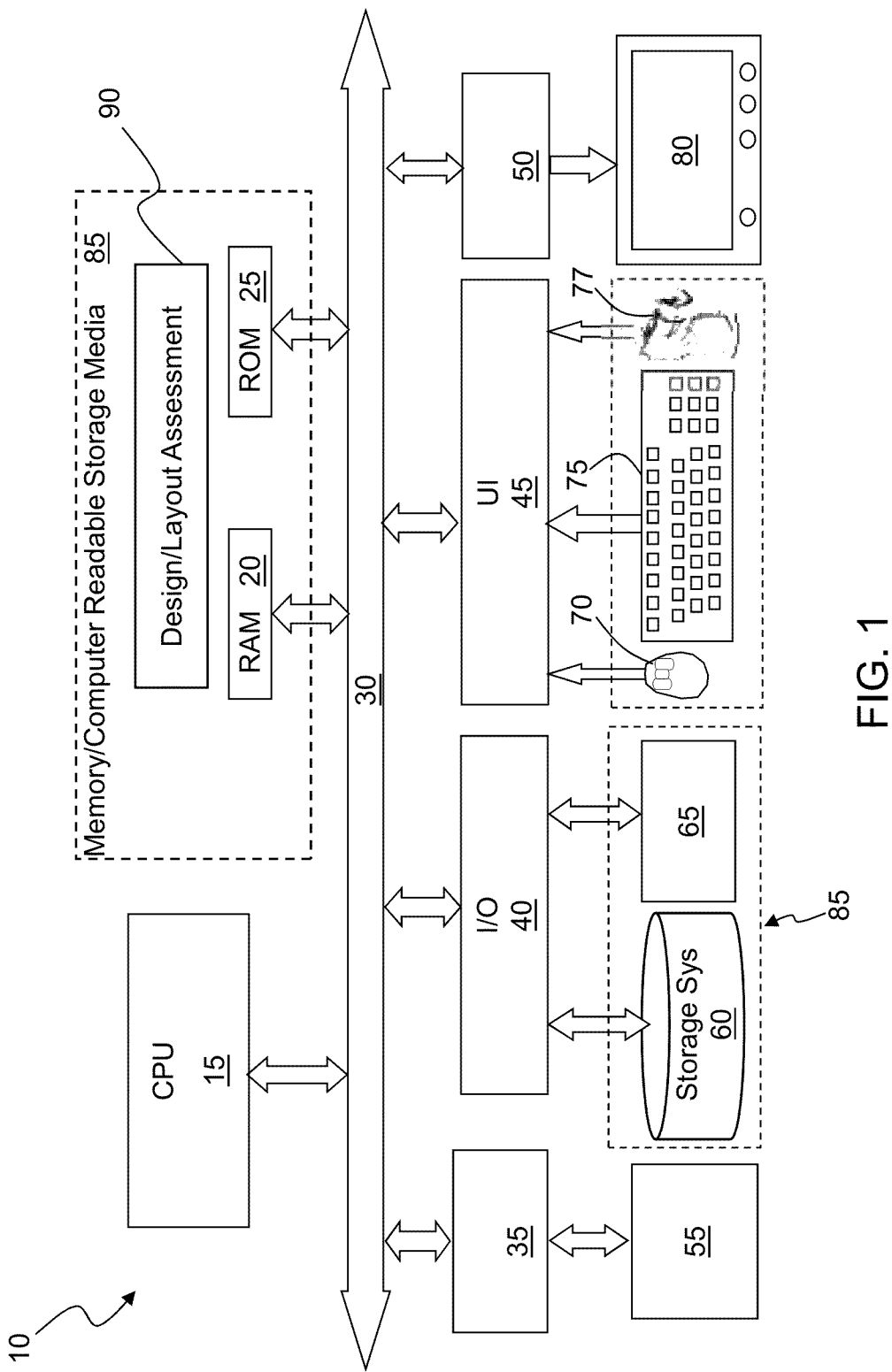
FIG. 1 is a schematic diagram of a computing environment with which embodiments of the invention disclosed herein can be implemented and in which embodiments of the invention disclosed herein can be executed.

It is noted that the drawings of the invention are not necessarily to scale. The drawings are intended to depict only typical aspects of the invention, and therefore should not be considered as limiting the scope of the invention. It is understood that elements similarly numbered between the FIGURES may be substantially similar as described with reference to one another. Further, in embodiments shown and described with reference to FIGS. 1-9, like numbering may represent like elements. Redundant explanation of these elements has been omitted for clarity. Finally, it is understood that the components of FIGS. 1-9 and their accompanying descriptions may be applied to any embodiment described herein.

DETAILED DESCRIPTION

Broadly, embodiments of the invention disclosed herein employ signal analysis techniques, including, for example, compressive sensing, sparse representation and/or coding, and/or dictionary learning, to dramatically reduce processing load and runtime in layout novelty assessment, with a correlative dramatic increase in pattern assessment throughput. More specifically, embodiments create an adaptive sparse dictionary that serves as a formally minimized description of a library of compliant patterns. Candidate patterns can then be captured from a candidate layout and assessed using the dictionary, but can be assessed for difference from, as opposed to similarity to, compliant patterns.

A typical design evaluation technique includes conducting a prescriptive search, which typically begins with building a library L of known, manufacturable patterns $l_1, l_2, \ldots, l_i$. The patterns in library L are typically in compliance with design rules checking (DRC) and other standards, and so can be called compliant patterns. The library L can be built, for example, using a feature extraction technique on one or more layouts known to be compliant and/or manufacturable to scan the compliant layout(s) and extract compliant pattern(s)/, therefrom, though other techniques can be employed to build library L as may be suitable and/or desired. Examples of feature extraction techniques or routines that might be used include those disclosed in U.S. Pat. Nos. 7,415,695 and 8,201,132, the disclosures of which are incorporated by reference, though any other feature extraction technique can be employed as may be desired and/or suitable. For example, feature extraction can employ a "clip scan window" of a particular size, dependent in part on an optical radius of the instrument scanning the candidate layout and/or an allowed wire termination size. The clip scan window starts at a known location in the compliant layout, captures an image of the portion of the compliant layout visible in the window, then progresses to a next location, captures an image of the portion of the compliant layout there, and continues until the entire compliant layout has been scanned. Depending on the particular technique, each captured image can be treated as a compliant pattern $l_i$, or analysis can be performed on the captured images to identify compliant patterns $l_i$.

With library L built, feature extraction is typically employed to identify at least one candidate pattern $u_i$ of a candidate design U, which candidate pattern(s) $u_i$ are then assessed to determine how similar they are to each compliant pattern $l_i$ in library L. To assess each candidate pattern $u_i$, a "nearest neighbor search" (NNS) can be conducted, in which a measure of the similarity between candidate pattern $u_i$ and each compliant pattern $l_i$ of the library L can be determined. A simplest form of a NNS is a linear or so-called "naïve" search, in which, for example, the Euclidean distance $D(l_i,u_i)=\|l_i-u_i\|_2=\sqrt{\Sigma_i(l_i-u_i)^2}$ between the candidate pattern $u_i$ and each pattern $l_i$ in L can be used. Euclidean distance is, of course, based on the Euclidean norm or $l_2$-norm derived from the definition of the $l_g$-norm of a vector x as $\|x\|_{l_g}=\sqrt[g]{\Sigma_i|x_i|^g}$, with $g \in \mathbb{R}$. It should be noted that the term "Euclidean norm" is also used in the art to refer to the Frobenius norm, described below, but in the instant description and claims, "Euclidean norm" will only be used to refer to the $l_2$-norm.

If the candidate pattern $u_i$ is represented by a Fourier Transform or a Discrete Cosine Transform, the Euclidean distance can be performed on a one dimensional array (a vector) of coefficients, computing the difference between the signal of the candidate pattern $u_i$ and that of a respective known pattern $l_i$ of library L. Typically, principle component analysis (PCA) dimensionality reduction can be performed to reduce the computational cost per distance calculation. Candidate patterns with a Euclidean distance above a threshold distance value can be termed non-matching and can go through a waiver process. An example of a waiver process can involve a more detailed optical and resist simulation process, which would be costly to perform on the entire layout during optical proximity correction (OPC), and some manual or automated inspection of resulting dimensions and tolerances.

The cost of such an NNS can be significant, however, inasmuch as the number of compliant patterns in library L can be in the hundreds of millions. As a result, the distance and threshold compare process can require very substantial computational power since hundreds of millions of computations must be performed for each candidate pattern $u_i$. In addition, the number of clips or captured images of the candidate layout U can be very large, particularly where scanning uses overlapping windows at a resolution of allowed wire termination points. Thus, a typical layout assessment process can result in determining at least $(\text{size}(U)) \cdot (\text{size}(L))$ operations, perhaps as many as $10^{16}$ distance and threshold comparison operations. The number of operations can be reduced by employing space partitioning, such as by using k-d trees, which iteratively bisect the search space into two regions each containing half of the points of the parent region so that queries can be performed via traversal of the tree from the root to a leaf by evaluating the query point at each split. Even so, best case performance for such more efficient search data structures can be proportional to [size(U)]·[log(size(L))], and is probably not achievable since such k-d-tree-based NNSs tend to degenerate toward linear or naïve search performance ((size (U))·(size(L)), rather than [size(U)]·[log(size(L))]) as the dimension (length) of a feature vector increases.

Additional refinements of distance based computation have continued to address the need to find novel patterns and representative libraries within a distance based framework. For example, the "Fuzzy Swampfinder" system used the Walsh basis to represent sample patterns (see, for example, U.S. Pat. No. 8,201,132, incorporated by reference above, as well as U.S. Pat. No. 7,685,544, the disclosure of which is incorporated by reference). This technique could be used, for example, to find the nearest matches between candidate patterns and known patterns, and included clustering vectors to choose representative patterns for testing. This allowed problems with optical proximity checking (OPC) to be found using optical rules checking (ORC) on a small representative layout prior to a full OPC run, reducing computational demands. A variant of this approach is to search for nearest neighbor patterns via a two level search, matching first on a cluster of representatives, then to members of the nearest cluster. Another previous technique, the U.C. Berkeley Pattern Matcher disclosed in U.S. Patent Application Publication No. 2003/0103189, the disclosure of which is incorporated by reference, finds unique representative patterns using a series of pixel block reductions, such as bit packing, which progressively reduce the set to be searched. The candidate matches can then be searched at higher resolution for more accuracy. Even these improved comparison techniques, however, become impractical when pattern sets L and U become very large, since the matching comparison still requires many operations.

Embodiments of the invention herein can reduce the computational load required to detect novel layouts and/or patterns by identifying patterns that are new, as opposed to identifying to which known patterns an unknown pattern is most similar. In other words, embodiments can reduce computational load by detecting what is different instead of a degree of similarity. In addition, while typical techniques use a number of samples determined by the Nyquist frequency 2n, where n is a minimum feature dimension of an input signal, embodiments require far fewer samples of a given pattern as a result of employing sparse coding, dictionary learning, compressive sampling/sensing, and/or other signal analyses in the context of semiconductor layouts, as will be explained below. Thus, while the cost $C_{NN}$ of determining nearest neighbors with NNS can be proportional to log(L)*O (2n), the cost in embodiments is significantly lower.

Embodiments can employ sparse representation or coding, which says that a signal that has a sparse representation in one basis $\Phi$ can have a concise representation in another basis $\Psi$ that is incoherent with the first basis $\Phi$. Sparsity thus says that a signal may have an information rate that is far smaller than the signal's bandwidth might suggest when expressed in a proper, incoherent representation basis $\Psi$. Two bases are incoherent when there is a lack of correlation between the paired bases, so that a signal having a concise representation in basis $\Psi$ must be spread out in a sensing or sampling domain (basis $\Phi$.)

Sparsity thus recognizes that most of a signal's information is held in a few relatively large coefficients, and that the signal can be reconstructed using just those few coefficients with little or no loss. For example, using Fourier Transforms, an input signal can be represented with a vector f=$\Psi$x, where $\Psi$ is an n×n matrix with $\psi_1, \psi_2, \ldots, \psi_n$ as columns. The vector f can be expanded into an orthogonal basis, such as a wavelet basis $\Psi=[\psi_1, \psi_2, \ldots \psi_n]$ according to:

$$f(t) = \sum_{i=1}^{n} x_i \psi_i(t) \tag{1}$$

where x is the coefficient sequence of f, $x_i = \langle f, \psi_i \rangle$. By keeping terms of $f_s(t)$ corresponding to a number s of the largest values of ($x_i$), we obtain $x_s$, which is a sparse vector with a sparsity level s. Any object with no more than s nonzero values can be referred to as s-sparse, and error can be determined using $\|f - f_s\|_{l_2}$, which can be used in additional processes, as will be explained below.

Embodiments can also use compressive sensing, which flows from the idea that one can recover a signal from far fewer samples or measurements than is used by typical and/or traditional techniques. The Nyquist rate or frequency has been a limitation on sampling in conventional techniques, but compressive sensing uses samples at far below the Nyquist rate for a given signal by employing and/or extending the principles of sparsity and incoherence. Even with fewer samples, the original input can be recovered accurately.

Particularly efficient implementations of compressive sampling and/or sensing can include using projections through a set of random matrices as the sensing domain $\Phi$, and can become more efficient with more random sampling. For example, sampling n vectors independently and uniformly on the unit sphere $\mathbb{R}^n$ and orthonormalizing them into the sampling or sensing basis $\Phi$ can produce a uniform, random sensing matrix A, which will likely have a coherence of approximately $\sqrt{2\log n}$. This implies that random waveforms ($\phi_k(t)$) with independent identically distributed (i.i.d.) entries, such as Gaussian or ±1 binary entries, will have a very low coherence with a fixed representation basis $\Psi$.

Assuming that the coefficient sequence x of f is s-sparse in the representation basis $\Psi$, then, for some positive constant C, a number m of measurements to be taken uniformly at random in the sampling domain $\Phi$ can be found using the relationship $$m \geq C \cdot \mu^2(\Phi, \Psi) \cdot s \cdot \log n \tag{2}$$

Sensing matrix A can be defined as A=$\Psi\Phi$, an m×n matrix such that an input signal y=Ax. By constraining values in A using the restricted isometry property (RIP) $\delta$ such that $$(1 - \delta_s)\|x\|_{l_2}^2 \leq \|Ax\|_{l_2}^2 \leq (1 + \delta_s)\|x\|_{l_2}^2 \tag{3}$$

holds for all s-sparse coefficient vectors x, and also limiting the RIP such that $\delta_{2s} < \sqrt{2} - 1$, a linear program signal reconstruction relationship $$\min_{\tilde{x} \in \mathbb{R}^n} \|\tilde{x}\|_{l_1} \text{ subject to } A\tilde{x} = y = (Ax) \tag{4}$$

can apply, and its solution can obey $$\|x^* - x\|_{l_2} \leq C_0 \cdot \frac{\|x - x_s\|_{l_1}}{\sqrt{s}} \text{ and } \|x^* - x\|_{l_1} \leq C_0 \cdot \|x - x_s\|_{l_1}, \tag{5}$$

where $x^*$ is the reconstructed vector x, $C_0$ is an arbitrary constant, and $x_s$ is the vector x with all but the largest s components set to zero. The first term in each relationship in (5) expresses reconstruction error, which advantageously is also the Euclidean distance between the vector x and the reconstructed vector x*. The problem in (4) can be useful in situations in which x is guaranteed to be s-sparse, but a relationship that can be employed in recovery when a signal may not be sparse and/or when data is noisy can be obtained by using $l_1$ optimization with relaxed constraints as $$\min \|\tilde{x}\|_{l_1} \text{ subject to } \|A\tilde{x}-y\|_{l_2} \le \epsilon \qquad (6),$$

where $\epsilon$ bounds the amount of noise in the data. It should be noted that instead of solving the linear programming minimization problem of (4) or (6) above for recovery of the vector x, one could apply the Dantzig selector (described, for example, in "The Dantzig selector: statistical estimation when p is much larger than n," Candés and Tao, *Ann. Statist.* 35 (2007), no. 6, pp. 2313-2351, incorporated by reference in its entirety), a combinatorial optimization program such as proposed by Haupt and Nowak (described, for example, in "Decentralized Compression and Predistribution via Randomized Gossiping," IPSN'06, April 19-21, 2006, Nashville, Tenn., USA, incorporated by reference in its entirety), and/or any other suitable greedy algorithm, such as matching pursuit (MP, described, for example, in "Matching Pursuits with Time-Frequency Dictionaries," Mallat and Zhang, *IEEE Transactions on Signal Processing*, December 1993, pp. 3397-3415, incorporated by reference in its entirety) and/or orthogonal matching pursuit (OMP, described, for example, in "Orthogonal Matching Pursuit: recursive function approximation with application to wavelet decomposition," Pati, Rezaiifar, and Krishnaprasad, *Asilomar Conf. on Signals, Systems and Comput.*, 1993, incorporated by reference in its entirety). However, using the same assumed $\delta_{2s} < \sqrt{2}-1$, some constant $C_0$, and an additional constant $C_1$, the solution x* to (6) can obey $$\|x^* - x\|_{l_2} \le C_0 \cdot \frac{\|x - x_s\|_{l_1}}{\sqrt{s}} + C_1 \cdot \epsilon. \qquad (7)$$

Sensing matrix $A=\Phi\Psi$ can be formed in a number of ways. For example, as a result of the constraints imposed above, an upper bound can be derived for the number of samples $m \le C \cdot s \log n/s$. If we also define $A=R\Phi\Psi$, with R extracting m coordinates uniformly at random, the upper limit to the number of samples can be $m \le C \cdot s(\log n)^4$. Examples of forming the sensing matrix $\Phi$ can include, but are not necessarily limited to, (1) sampling n column vectors uniformly at random on the unit sphere $\mathbb{R}^m$;

(2) sampling i.i.d. entries from the normal distribution with mean 0 and variance $$\frac{1}{m};$$

and (3) sampling i.i.d. entries from a symmetric Bernoulli distribution $$\left( \text{e.g. } P\left(\Psi_{i,j} = \pm \frac{1}{\sqrt{m}}\right) = \frac{1}{2} \right)$$

or other sub-Gaussian distribution.

By taking approximately $$O\left(s \, \log\left(\frac{n}{s}\right)\right)$$

random projections, one can obtain enough information to reconstruct an input signal at least as good as that obtained from $y_s$, the best s-term approximation of the input signal y in sparse coding. An additional facet of this technique is that a sensing matrix A obeying RIP can retain a substantially accurate representation of the Euclidean distance of an s-sparse input signal. When the RIP is held to less than $\sqrt{2}-1$, such as 0.25, a number of samples m can be at least $s \cdot (\log n)^4$ times some constant C that will vary depending upon a particular situation, such as $C \le 6$. The signal can then be recovered using, for example, (7) above, such as with same RIP $\delta \le \sqrt{2}-1$ and constant values $C_0 \le 6$, $C_1 \le 6$.

Thus, to recap, embodiments can sample non-adaptively in a domain incoherent with that in which the signal is represented, then apply linear programming, convex optimization, and/or one or more greedy algorithms after acquisition to determine a suitable set of coefficients to represent the input signal. The number of samples taken should be no less than $s \cdot \log n$, where n is the dimension of the signal, to ensure recovery of the input signal, whatever it is, from the sparse data. As a result of application of this sampling technique, the data can be acquired in compressed form and need only be decoded and/or decompressed to recover the signal. As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing, such as can be considered non-transitory. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible or non-transitory medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks and/or configure the computer or other programmable data processing apparatus to perform a method and/or functions in accordance with embodiments.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 1 shows an example of a block diagram of a general-purpose computer system 10 which can be used to implement the method, system, computer program, and/or computer program product described herein. The method, system, computer program, and/or computer program product may be coded as a set of instructions on removable or hard media for use by general-purpose computer, and thus may, in embodiments, include a computer program product. FIG. 1 is also a schematic block diagram of a general-purpose computer for practicing the present invention. Computer system 10 can have at least one microprocessor or central processing unit (CPU) 15. CPU 15 can be interconnected via a system bus 30 to machine readable media 85, which can include, for example, a random access memory (RAM) 20, a read-only memory (ROM) 25, a removable and/or program storage device 65, and/or a mass data and/or program storage device 60. An input/output (I/O) adapter 40 can connect mass storage device 60 and removable storage device 65 to system bus 30. A user interface 45 can connect a keyboard 75 and/or a mouse 70 and/or an image capture device 77, such as a camera, and/or any other suitable input device to system bus 30, and a port adapter 35 can connect a data port 55 to system bus 30 and a display adapter 50 can connect a display device 80. ROM 25 can include the basic operating system for computer system 10. Examples of removable data and/or program storage device 65 include magnetic media such as floppy drives, tape drives, portable flash drives, zip drives, and optical media such as CD ROM or DVD drives. Examples of mass data and/or program storage device 60 include hard disk drives and non-volatile memory such as flash memory. In addition to keyboard 75 and mouse 70, other user input devices such as trackballs, writing tablets, pressure pads, microphones, light pens and position-sensing screen displays may be connected to user interface 45. Examples of display device 80 include cathode-ray tubes (CRT), liquid crystal diode (LCD) displays, light emitting diode (LED) displays, plasma displays, holographic displays, tactile displays, and/or any other display device as may be available, suitable, and/or known now and/or in the future.

A machine readable computer program may be created by one of skill in the art and stored in computer system 10 or a data and/or any one or more of machine readable medium 85, such as in the form of a computer program product 90, to simplify the practicing of this invention. In operation, information for the computer program created to run the present invention can be loaded on the appropriate removable data and/or program storage device 65, fed through data port 55, acquired with image capture device 77, and/or entered using keyboard 75. A user can control the program by manipulating functions performed by the computer program and providing other data inputs via any of the above mentioned data input means. Display device 80 can provide a means for the user to accurately control the computer program and perform the desired tasks described herein.

Computer program product 90 according to embodiments of the invention disclosed herein can be stored in memory and/or computer readable storage media 85, in embodiments. While shown as outside of RAM 20 and ROM 25, it should be readily apparent that computer program product 90 and/or portions thereof can reside in these and/or any other storage medium accessible by computer system 10. It should be noted that CPU(s) 15 can in embodiments be called a computing device(s), but that computer system 10 as a whole, or portions thereof, could also be called a computing device.

Figure 2:
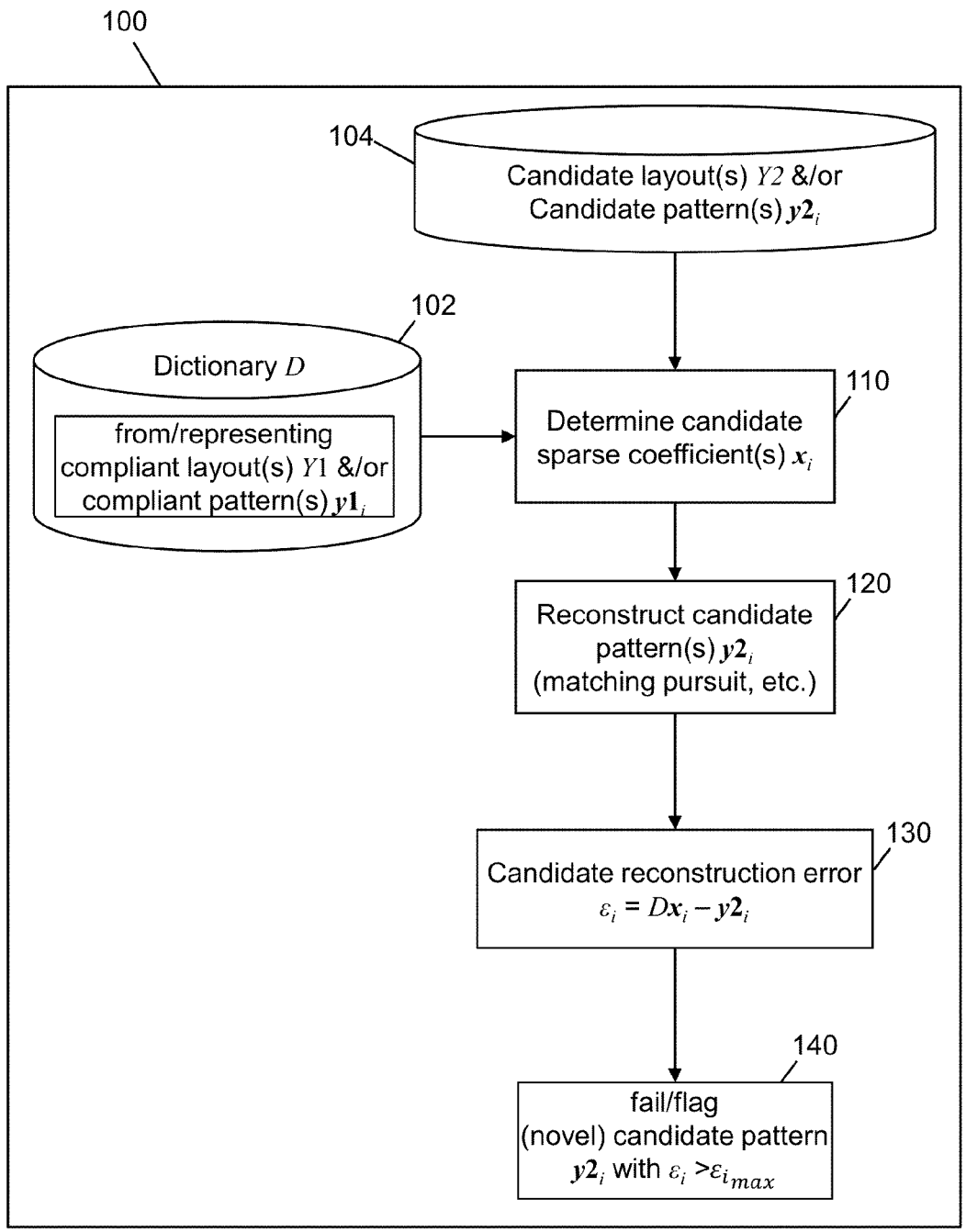
FIG. 2 is a schematic diagram of a layout assessment system and/or computing environment with which embodiments of the invention disclosed herein can be implemented and in which embodiments of the invention disclosed herein can be executed.

With reference to FIG. 2, a semiconductor device design layout assessment system 100 can include a sparse pattern dictionary D, which can, for example, be provided from a repository 102 or the like, such as a computer readable storage medium or any other suitable source. Dictionary D can be an overcomplete basis set or dictionary and can include a respective atom $d_k$ representing at least part of each of at least one compliant pattern $y1_i$ of at least one acquired compliant layout Y1 known to comply with at least one feasibility parameter. For example, each atom $d_k$ can include a respective basis function representing at least part of a respective compliant pattern $y1_i$. A candidate layout Y2 including at least one candidate pattern $y2_i$ can be provided, such as from a candidate library 104 or other source, tested using a candidate sparse coefficient determination arrangement 110, a candidate pattern reconstructor 120, a candidate pattern comparator 130, and a pattern flagger 140.

With continued reference to FIG. 2, candidate sparse coefficient determination arrangement 110 can be configured to determine at least one candidate sparse coefficient $x_i$ for each candidate pattern $y2_i$, and candidate pattern reconstructor 120 can be configured to create a reconstructed candidate pattern $y2_i^* = Dx_i$ based on sparse pattern dictionary D and the at least one candidate sparse coefficient $x_i$. Candidate pattern comparator 130 can be configured to use the reconstructed candidate pattern $Dx_i$ and the candidate pattern $y2_i$ to determine a candidate reconstruction error $\epsilon_i$ therebetween, and pattern flagger 140 can flag any candidate pattern responsive to a condition based on the respective candidate reconstruction error $\epsilon_i$. For example, the condition can include having a candidate reconstruction error $\epsilon_i$ larger than a threshold or maximum candidate reconstruction error $\epsilon_{i_{max}}$, and/or can include having a sparsity larger than a threshold or desired or maximum sparsity level $s_0$, which can be determined using candidate reconstruction error $\epsilon_i$. The flag can represent that the candidate pattern $y2_i$ differs from what is known based on at least the condition resulting in flagging the candidate pattern $y2_i$.

In embodiments, sparse pattern dictionary D can be built from a library L of compliant layouts Y1, each compliant layout including at least one compliant pattern $y1_i$. For example, with reference to FIG. 5, each compliant layout Y1 can be an array or matrix of dimension Y1={N×d} in which each column n can be a vector of dimension or length d that can be a basis function representing a respective compliant pattern $y1_i$. In addition, compliant layout Y1 can be said to be the product of dictionary D and a matrix X of compliant coefficients, in this case sparse compliant coefficients, such that Y1=DX, as will be discussed in more detail below. In the instant description and claims, "pattern" and "basis function" and/or "(representative) vector" are used interchangeably, so that it should be understood that, for example, "compliant pattern $y1_i$" refers to both the pattern itself and to the basis function or vector by which the pattern is represented.

Figure 5:
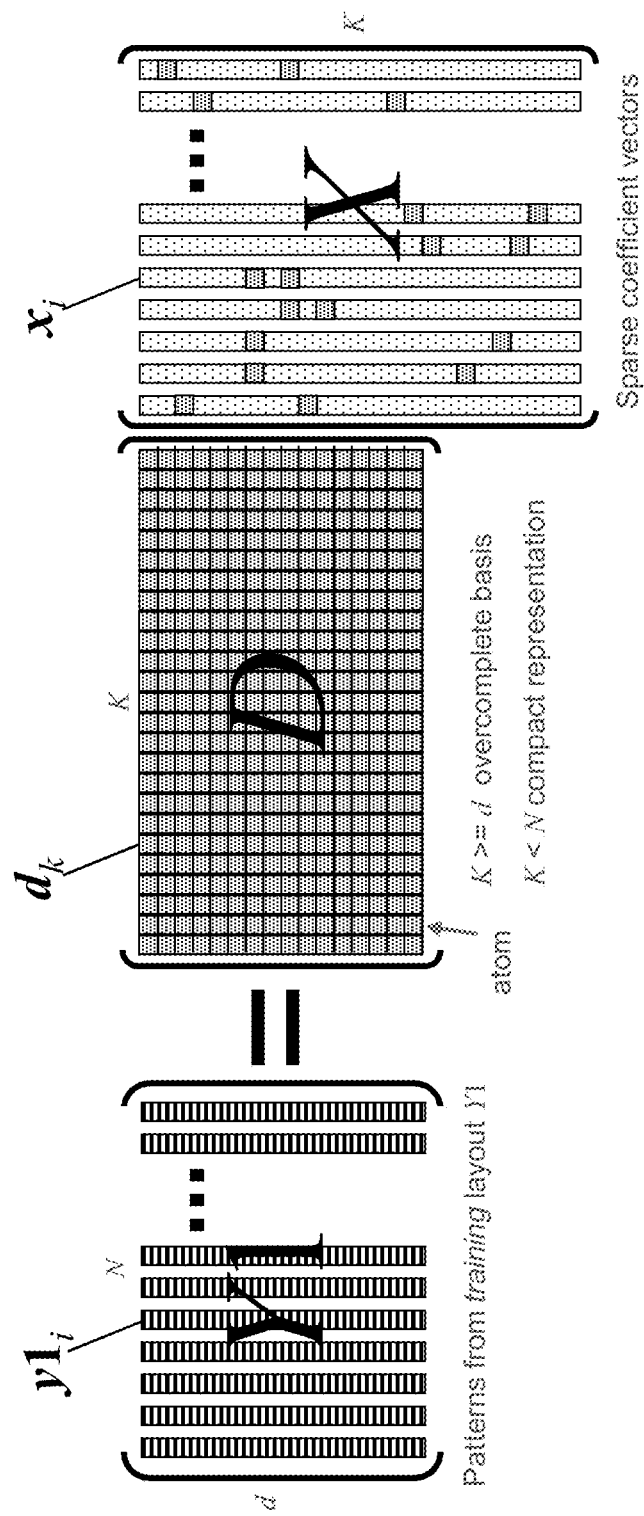
FIG. 5 is a schematic illustration of a layout assessment method according to an embodiment of the invention disclosed herein.

The at least one compliant pattern $y1_i$ can be acquired, for example, by scanning each compliant layout Y1 with a window of a learning resolution d. Dictionary D can thus be an array or matrix of dimension {K×d}, as schematically illustrated in FIG. 5, including K atoms $d_k$ that can be vectors of length or dimension d each linearly combined to represent a compliant pattern $y1_i$. Advantageously, a basis function for each compliant pattern $y1_i$ can take the form of a vector of compliant coefficients $x_i$ multiplied by each atom $d_k$ of dictionary D. By treating each compliant pattern $y1_i$ as an input signal used to create and/or add to dictionary D, a respective compliant coefficient vector $x_i$ can be obtained to accurately represent compliant pattern $y1_i$, such that $y1_i = Dx_i$ for $y1_i \in \mathbb{R}^d$, $x_i \in \mathbb{R}^K$, and $D \in \mathbb{R}^{d \times K}$. As a result of these definitions and by specifying that the number of atoms K be larger than the length d of each compliant pattern $y1_i$, $x_i$ is sparse and D is overcomplete, meaning that D includes more basis functions in the array or dictionary D than the dimension d of the input signal, compliant pattern $y1_i$. Each vector of sparse compliant coefficients $x_i$ for a respective compliant pattern $y1_i$ can thus be a column of matrix X according to Y1=DX.

Figure 3:
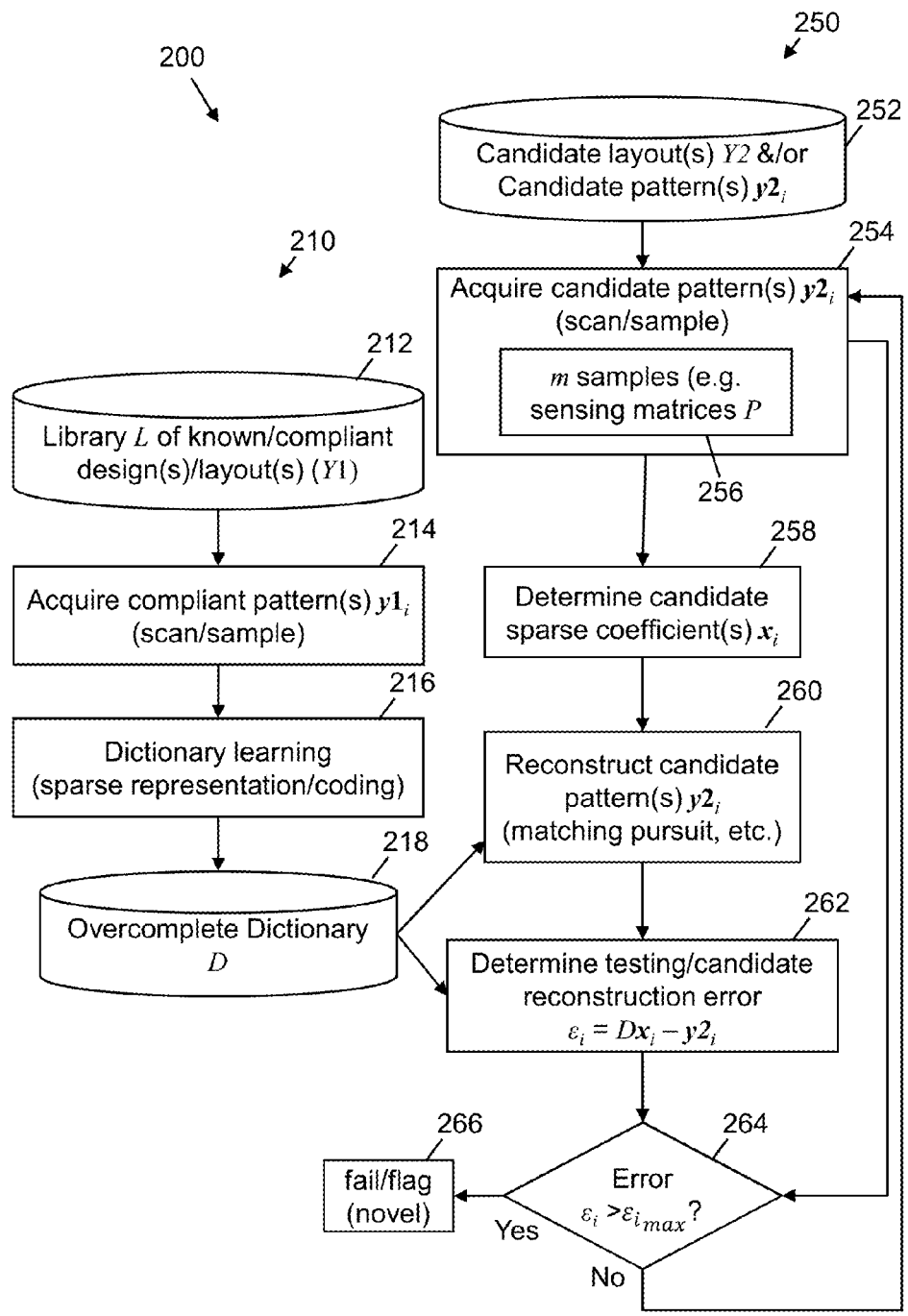
FIG. 3 is a schematic flow diagram of a layout assessment method according to an embodiment of the invention disclosed herein.

With reference to FIG. 3, a method 200 according to embodiments of the invention disclosed herein can be implemented, for example, with a dictionary acquiring or learning fork 210 and a testing or candidate assessment fork 250. In dictionary acquiring or learning fork 210, dictionary D can be supplied from previous construction or can be built or learned in embodiments. For example, a test site can be employed, whether real, synthetic, and/or virtual, to house a body or library L of compliant layouts and/or patterns 212. Compliant patterns can be acquired 214, such as by receiving patterns previously acquired or by using a scanning window of resolution d={n×n} to scan a provided and/or acquired compliant layout Y1 one window at a time until the complete layout Y1 has been scanned. However compliant patterns $y1_i$ are acquired, sparse representation and/or coding can be applied 216 to learn dictionary D 218 where embodiments include learning dictionary D.

Figure 4:
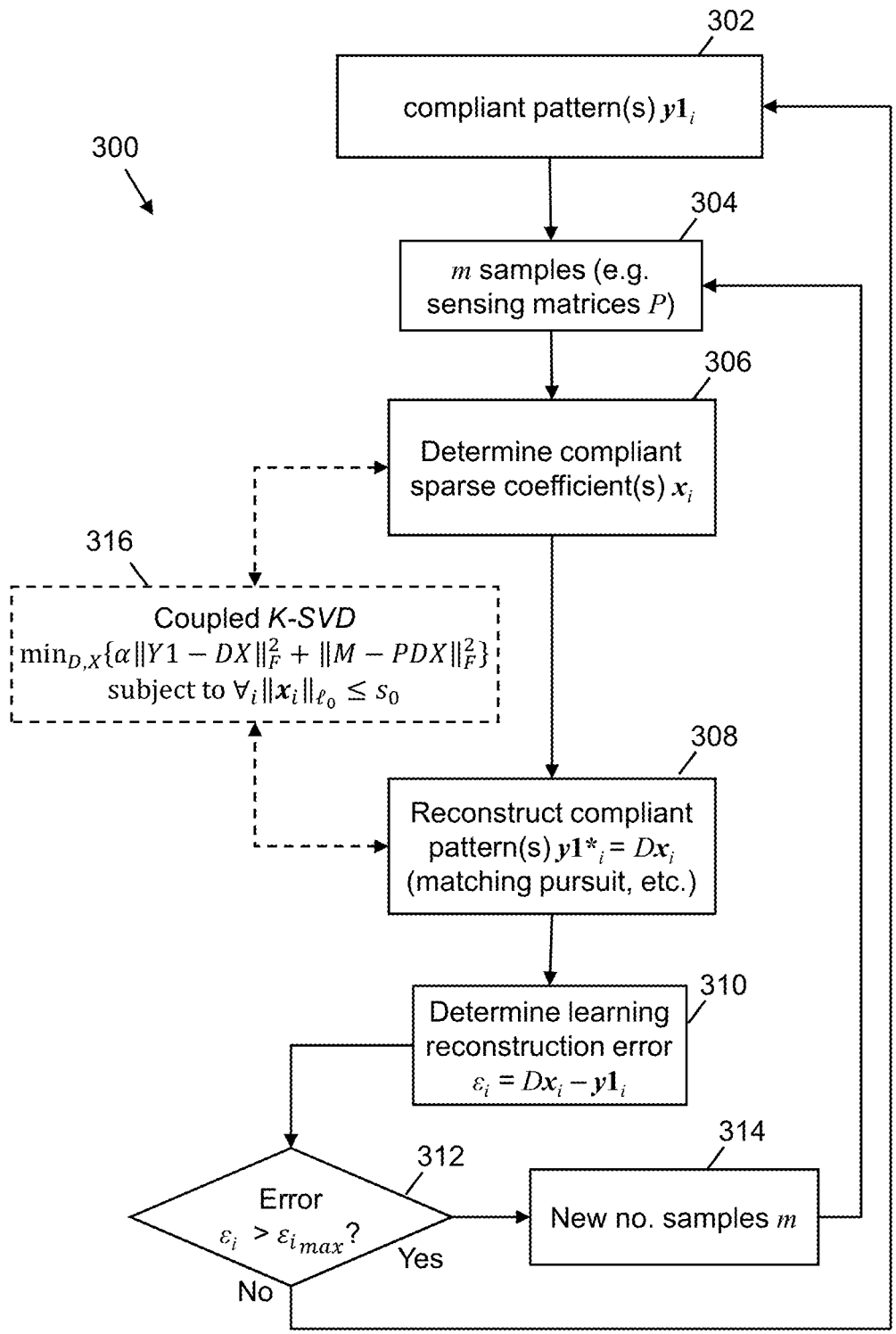
FIG. 4 is a schematic flow diagram of a layout assessment method according to an embodiment of the invention disclosed herein.

An example of a method 300 of learning or building dictionary D is shown schematically in FIG. 4. For example, using at least one compliant pattern (block 302), a number m of samples can be taken (block 304), and at least one and/or a set of compliant sparse coefficients $x_i$ and at least one basis function or atom $d_i$ to be added to dictionary D can be found for each compliant pattern $y1_i$ (block 306). Compliant pattern $y1_i$ can be reconstructed (block 308), such as by using the relationship $y1^*_i = Dx_i$ or another relationship and/or technique as will be described. Reconstructed compliant pattern $Dx_i$ and compliant pattern $y1_i$ can be used to determine learning reconstruction error $\epsilon_i$ (e.g., using $Dx_i - y1_i$) (block 310). A check to see if learning reconstruction error $\epsilon_i$ exceeds a threshold or maximum value $\epsilon_{i_{max}}$ can be made (block 312), a new number of samples m to be used can be determined if learning reconstruction error $\epsilon_i$ is too high (block 314), and the new number of samples m can be used to sample the particular compliant pattern $y1_i$ (return to block 304, repeat 306-312). If learning reconstruction error $\epsilon_i$ is below the threshold or maximum value $\epsilon_{i_{max}}$, then the respective compliant sparse coefficient(s) $x_i$ and atom $d_k$ are deemed acceptable and a next compliant pattern can be assessed. As seen in block 316 of FIG. 4, one technique that can be used to determine compliant sparse coefficient(s) $x_i$ and to reconstruct compliant patterns $y1_i$ can include so-called Coupled K-SVD, as will be described below.

More particularly, compliant sparse coefficients $x_i$ can be determined, for example, using the Dantzig selector, a combinatorial optimization program such as proposed by Haupt and Nowak discussed above, and/or any other suitable greedy algorithm, such as OMP. OMP can be applied in embodiments by using the relationship $$\min \sum_{i}^{N} \|y1_i - Dx_i\|_{l_2} \text{ such that } \|x_i\|_{l_0} \le s_0, \quad (8)$$

in iteration, alternating between holding D constant and holding $x_i$ constant with the constraint that sparsity s of $x_i$ must be no more than a predefined and/or acquired desired sparsity level or value $s_0$. Desired sparsity level or value $s_0$ can be acquired, for example, from a data file, a transmission, a user entry, and/or any other suitable manner. As seen in (8), the $l_0$-norm of $x_i$ can be used to determine its sparsity since the zero norm will return the number of non-zero entries in $x_i$. As also seen in (8), the $l_2$-norm, also called the Euclidean norm by some, can be used in minimizing reconstruction error, but it should be clear that other norms could be used as may be suitable and/or appropriate.

Figure 6:
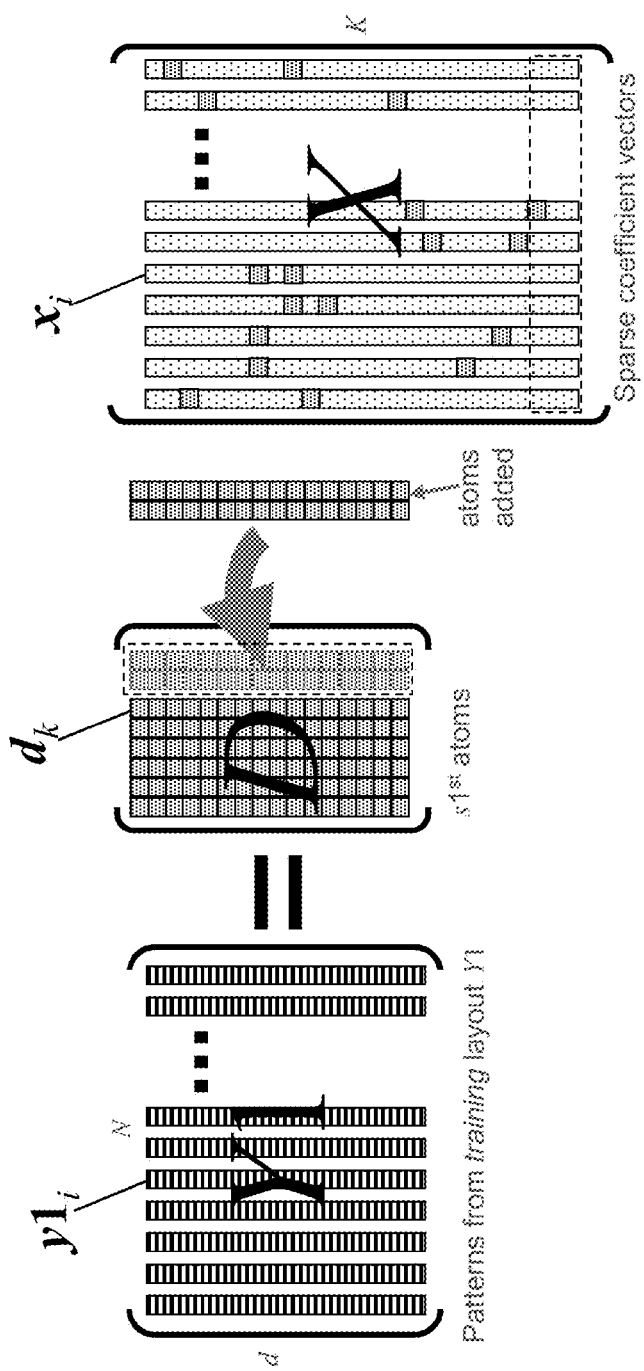
FIG. 6 is a schematic illustration of a layout assessment method according to embodiments of the invention disclosed herein.

As a result of sparsity of X, dictionary D in embodiments can include a number of atoms $d_k$ equal to the sparsity level or value of X, yet still accurately represent compliant layout Y1. This is schematically illustrated in FIG. 6, which also suggests that when a compliant pattern $y1_k$ is added, its representation in dictionary D can in embodiments be added as at least one new atom $d_k$ or can in other embodiments be incorporated into the same number of atoms $d_k$. The process of updating and/or adding to dictionary D will be explained in more detail below.

With coefficients $x_i$ and dictionary D established, reconstruction can be performed using OMP or another suitable greedy algorithm, which can allow fast reconstruction. For example, as with (8), OMP can be performed with a limit on sparsity s to reconstruct compliant sparse coefficient(s) $x_i$, such as by using the relationship $$x_i^* = \min \|y1_i - Dx_i\|_{l_2} \text{ subject to } \|x_i\|_{l_0} \le s_0 \quad (9a).$$

Alternatively, OMP can be performed with a limit on learning reconstruction error $\epsilon_i$, such as by imposing a predefined threshold or maximum learning reconstruction error $\epsilon_{i_{max}}$, which can be acquired in any suitable fashion, using the relationship $$x_i^* = \min \|x_i\|_{l_0} \text{ subject to } \|y1_i - Dx_i\|_{l_2} \le \epsilon_{i_{max}} \quad (9b).$$

As described above, embodiments can learn a set of compliant coefficients $x_i$ and at least one basis function or atom $d_k$ for each compliant pattern $y1_i$ in library L and can collect the atoms $d_k$ into sparse dictionary D. While OMP has been identified as part of sparse coding in a dictionary learning technique that can be used, it should be clear that any suitable technique can be applied. To update dictionary D, an additional technique can be applied, such as the method of optimal directions (MOD) of Engan et al. ("Method of optimal directions for frame design," *Proc. IEEE Int. Conf. Acoust., Speech, Signal Process.*, 1999, vol. 5, pp. 2443-2446, incorporated by reference in its entirety) and/or the K-SVD technique introduced by Aharon et al. ("The K-SVD: An algorithm for designing of overcomplete dictionaries for sparse representation," *IEEE Trans. Pattern Anal. Mach. Intell.*, vol. 27, no. 12, pp. 1945-1959, 2005, incorporated by reference in its entirety), and/or any other technique as may be desired and/or appropriate. K-SVD can be advantageous in learning dictionary D in that it can avoid large matrix inversions. In addition, an incremental version of K-SVD can be used to build dictionary D one pattern at a time. Such an incremental version of K-SVD is disclosed, for example, in "Stagewise k-SVD to Design Efficient Dictionaries for Sparse Representations," *IEEE Signal Processing Letters*, vol. 19, no. 10, 2012, which is incorporated by reference in its entirety. K-SVD can also be useful in adding subsequent patterns to dictionary D after an initial dictionary has been learned.

Application of K-SVD can be achieved, for example, by performing rank-one singular value decomposition (SVD) of a residual $e_k=(y1_j-(Dx_i+d_kx_{j,k}))$ K times, K being the number of columns in dictionary D, and the residual $e_k$ representing the difference between the input matrix Y1 and the change in the reconstructed matrix DX with and without a new atom $d_k$ that can introduce to dictionary D at least a partial representation of additional compliant pattern $y1_k$. Note that X here represents a matrix including a plurality compliant sparse coefficient vectors $x_i$, each vector $x_i$ being a respective column of matrix X. In particular, K-SVD can be performed using rank-one approximation minimization of the Frobenius norm of residual $e_k$ as represented by $$\arg\min \left\| Y1 - \sum_{j \ne k} d_j x_j - d_k x_k \right\|_F, \quad (10)$$

where the Frobenius norm is defined as, for an m×n matrix A, $$\|A\|_F = \sqrt{\sum_{j=1}^{m} \sum_{k=1}^{n} |a_{i,j}|^2}. \quad (11)$$

As noted above, the $l_2$-norm is known in the literature as the Euclidean norm. The Frobenius norm is also known as the Euclidean norm, but only the $l_2$-norm will be called the Euclidean norm herein; the Frobenius norm will simply be called the Frobenius norm.

Referring again to FIG. 3, testing or candidate assessment fork 250 can assess at least one candidate layout Y2 and/or candidate pattern $y2_i$ some repository or other source 252 using dictionary D, however it is acquired and/or provided. If not provided, to test a candidate layout Y2, as outlined above, each candidate pattern $y2_i$ can be acquired (block 254), such as scanning and/or sampling candidate layout(s) Y2 to take a number m of samples (block 256), and used with sparse dictionary D to obtain at least one respective candidate sparse coefficient $x_i$ can be determined (block 258). Candidate pattern(s) $y2_i$ can be reconstructed (block 260), however, whereas previous techniques would reconstruct candidate pattern(s) $y2_i$ using basis function(s) and/or a dictionary based on candidate patterns $y2_i$, embodiments instead reconstruct candidate pattern(s) $y2_i$ using sparse pattern dictionary D based on compliant patterns $y1_i$ and the set of candidate sparse coefficients $x_i$ determined for a respective candidate pattern $y2_i$. Testing or candidate reconstruction error $\epsilon_i=Dx_i-y2_i$ can be determined for each set of candidate sparse coefficients $x_i$ (block 262), and a check can then be made to see whether testing or candidate reconstruction error $\epsilon_i$ is greater than a threshold or maximum testing or candidate reconstruction error $\epsilon_{i_{max}}$ (block 264). Any candidate pattern $y2_i$ for which testing reconstruction error $\epsilon_i$ exceeds the maximum testing reconstruction error $\epsilon_{i_{max}}$ can be considered novel or different from any compliant pattern $y1_i$ of a compliant layout Y1 in library L as represented in dictionary D, and can be flagged, set aside, identified, or otherwise processed as novel and/or different and/or failed (block 266). This is also illustrated schematically in FIG. 7, where schematic representations of the matrices and operations performed are shown according to embodiments. Any candidate pattern with error below the maximum testing or candidate reconstruction error $\epsilon_{i_{max}}$ can be considered not novel, not new, and/or known, can be labeled as such if so desired or ignored, and assessment and/or testing of additional candidate patterns and/or layouts can continue (in FIG. 3, return to block 254, repeat 254-264).

Figure 7:
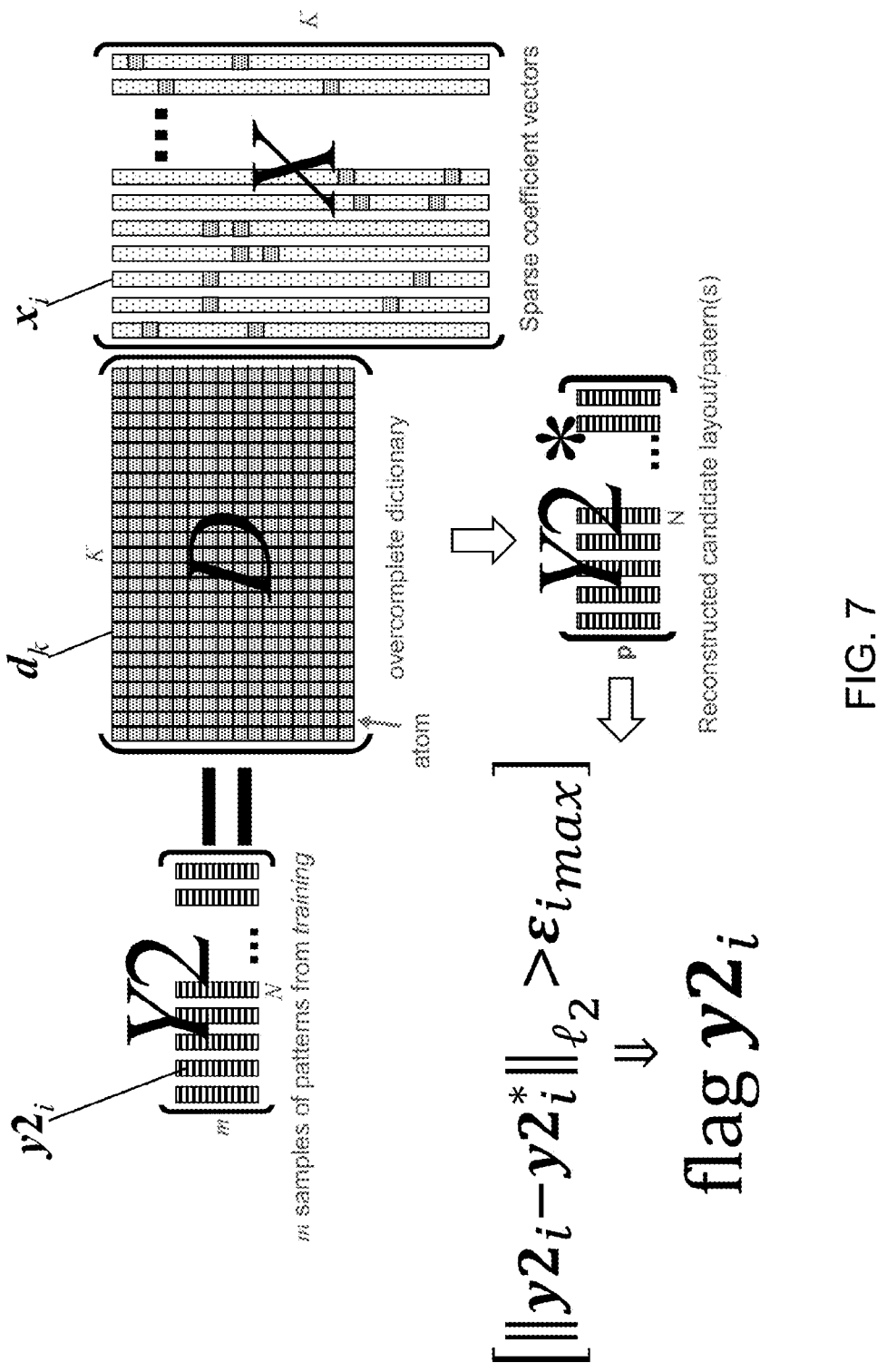
FIG. 7 is a schematic illustration of a layout assessment method according to an embodiment of the invention disclosed herein.
Figure 8:
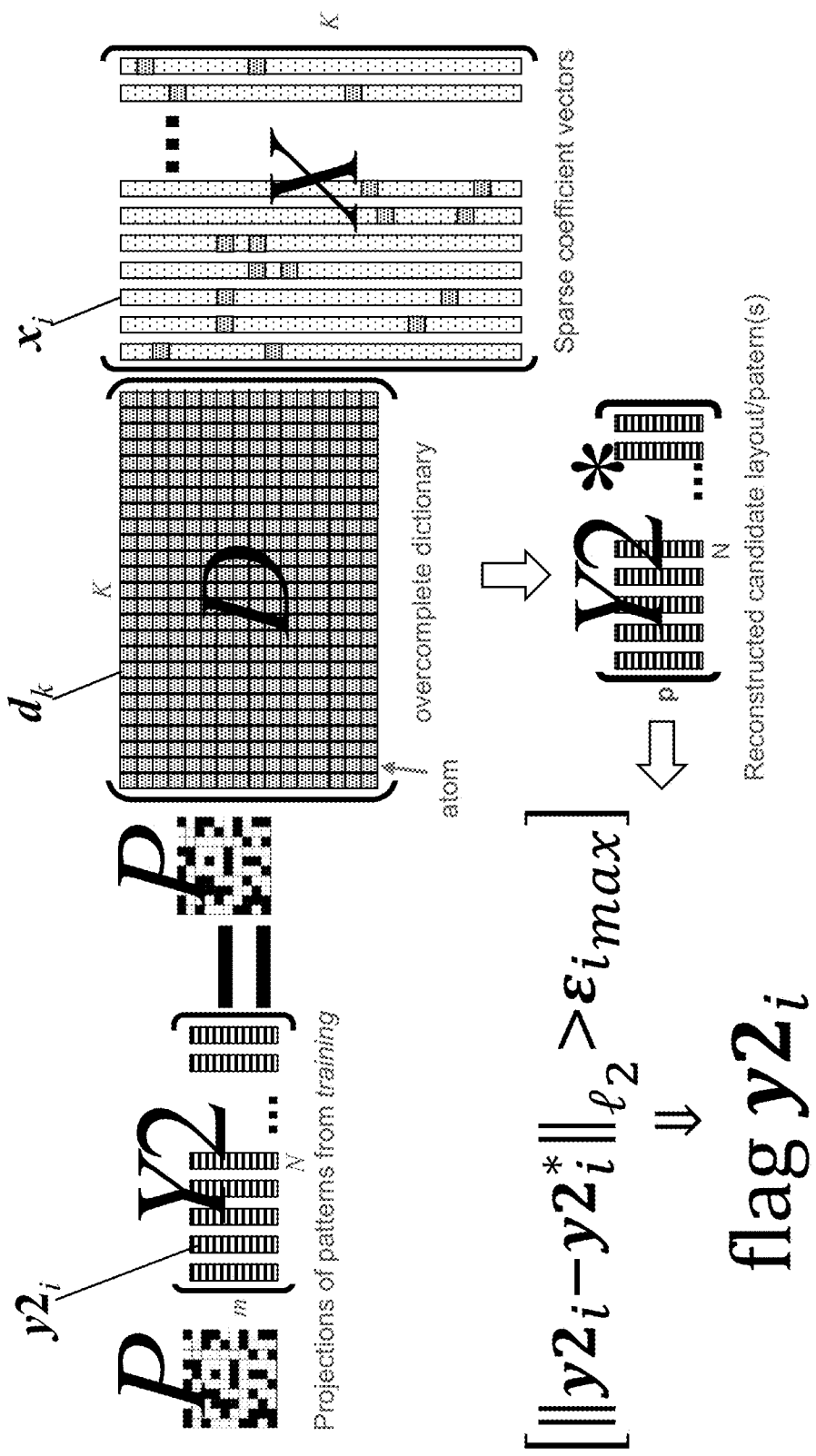
FIG. 8 is a schematic illustration of a layout assessment method according to embodiments of the invention disclosed herein.

More specifically, with reference to FIG. 7 and keeping FIGS. 1-4 in mind, a candidate layout Y2 can be scanned using a scanning window of resolution d={n×n} to capture an image of the visible portion of the candidate layout Y2, such as with image capture device 77, which image can be construed as a candidate pattern $y2_i$, and which can also be viewed as an input signal. The captured image need not be stored inasmuch as embodiments can determine sparse coefficients $x_i$ for each captured image during scanning, though the captured image could be stored if so desired. In addition, candidate patterns could be acquired prior to testing, such as stored on a computer readable storage medium or the like, and supplied to implementations of embodiments for assessment as opposed to requiring implementations of embodiments to perform pattern capture. Where embodiments engage in pattern capture, a candidate layout Y2 can be scanned one window at a time to acquire respective candidate pattern $y2_i$, determining sparse coefficients $x_i$ for each window as scanning progresses. Depending on a particular implementation, scanning can proceed while coefficients are determined for a candidate pattern, such that as coefficients $x_i$ for a first candidate pattern $y2_i$ are determined, acquisition of a next candidate pattern $y2_{i+1}$ can proceed, though in embodiments, acquisition of a next candidate pattern $y2_{i+1}$ can start after determination of sparse coefficients $x_i$ of the current candidate pattern $y2_i$. Thus, sparse coding can be performed to determine a set of coefficients $x_i$ for a current candidate pattern $y2_i$ using, for example, $$\|y2_i - Dx_i\|_{l_2}^2 \text{ subject to } \|x_i\|_{l_0} \leq s_0 \tag{12}$$

Reconstruction can then be performed using any suitable technique as described above, such as, for example, by performing OMP with a limit on sparsity, such as by imposing a predefined threshold or maximum candidate sparsity $s_0$ using the relationship $$x_i^* = \min\|y2_i - Dx_i\|_{l_2} \text{ subject to } \|x_i\|_{l_0} \leq s_0 \tag{13a}$$

or by performing OMP with a predefined maximum or threshold candidate reconstruction error $\epsilon_{i_{max}}$, such as by using the relationship $$x_i^* = \min\|x_i\|_{l_0} \text{ subject to } \|y2_i - Dx_i\|_{l_2} \leq \epsilon_{i_{max}} \tag{13b}$$

Another way to express testing or candidate reconstruction error $\epsilon_i$ is $$\epsilon_i = \|y2_i - y2_i^*\|_{l_2} \tag{14}$$

in which $y2_i^* = Dx_i$, so that (13a) can be expressed as $$x_i^* = \min\|\epsilon_i\|_{l_2} \text{ subject to } \|x_i\|_{l_0} \leq s_0 \tag{15a}$$

and (13b) can be expressed as $$x_i^* = \min\|x_i\|_{l_0} \text{ subject to } \|\epsilon_i\|_{l_2} \leq \epsilon_{i_{max}} \tag{15b}$$

In embodiments, any candidate pattern $y2_i$ with a candidate reconstruction error $\epsilon_i$ above predefined maximum candidate reconstruction error $\epsilon_{i_{max}}$, in other words for which $\epsilon_i > \epsilon_{i_{max}}$, can be flagged as novel, as schematically illustrated in FIG. 7. In embodiments, the maximum candidate reconstruction error $\epsilon_{i_{max}}$ can be determined using the learning reconstruction error from dictionary D. For example, any pattern whose candidate reconstruction error $\epsilon_i$ is greater than a maximum candidate reconstruction error of any compliant pattern $y1_i$ reconstructed by coefficients or basis functions in dictionary D such that $\epsilon_{i_{max}} = \max\|y1_i - Dx_i\|_{l_2}$ can be considered and/or flagged as novel. Novelty detection can be adjusted by adding a constant $C_{adj}$ and flagging as novel and candidate pattern $y2_i$ for which $$\epsilon_i > C_{adj} * \max\|y1_i - Dx_i\|_{l_2} \tag{16}$$

is true. In this relationship, $C_{adj}$ can be used to change a degree of similarity allowed between candidate patterns $y2_i$ and compliant patterns $y1_i$ in compliant layout Y1, with similarity decreasing as $C_{adj}$ is increased. Thus, a conservative implementation could use $C_{adj}=1$, and candidate patterns $y2_i$ flagged as novel can be relatively similar to those from compliant layout Y1, whereas a higher value for $C_{adj}$ would result in less similar candidate patterns $y2_i$ being flagged as novel.

In embodiments, it can be useful to prioritize analysis of novel patterns based on the degree of similarity and/or difference between candidate patterns $y2_i$, flagged as novel and compliant patterns $y1_i$ in compliant layout Y1. This can be achieved, for example, using testing or candidate reconstruction error, where a novel pattern with a larger reconstruction error value can receive a higher priority than a novel pattern with a lower reconstruction error value or vice versa as desired and/or appropriate.

Embodiments can further reduce processing load and/or runtime during testing of candidate layout(s) and/or pattern(s) by applying compressive sensing or sampling, as indicated above. More specifically, with reference to FIG. 8, embodiments can use a number of measures m<<d of each candidate pattern $y2_i$ and take a projection of the respective candidate pattern on random lines and/or a random binary matrix P. For example, the number of measures m can be determined in embodiments using the relationship $m \geq \mu(D,P) s \cdot \log n$, where P is the candidate sensing basis or candidate sensing matrix. By applying the same projection to both candidate pattern $y2_i$ and to dictionary D, a speedier reconstruction can take the form of $$x_i^* = \min\|x_i\|_{l_0} \text{ subject to } \|Py2_i - PDx_i\|_{l_2} \leq \epsilon_{i_{max}} \tag{17}$$

In embodiments, such random projections can be construed as hash matrices and/or hash functions, which can be used to reconstruct with sparse coefficients. In such embodiments, reconstruction of candidate pattern(s) $y2_i$ can be more limited, such that embodiments employing compressive sensing or sampling in testing can detect novelty, but not necessarily be able to reconstruct candidate pattern(s) $y2_i$ with enough accuracy that a reconstructed pattern could be used, for example, in a manufacturing process.

Figure 9:
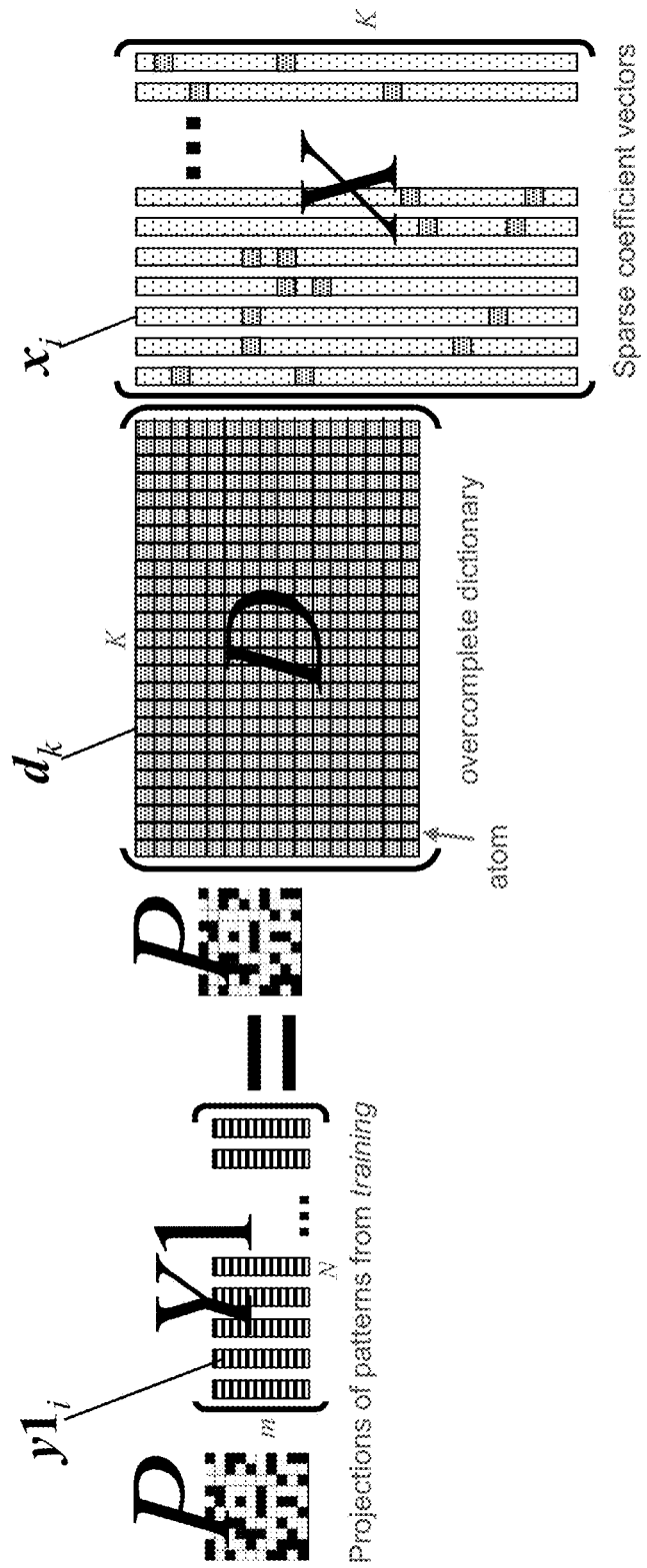
FIG. 9 is a schematic illustration of a layout assessment method according to embodiments of the invention disclosed herein.

In further embodiments, compressive sensing or sampling can be employed in dictionary learning, as schematically illustrated in FIG. 9. Thus, dictionary D can include projections of compliant patterns $y1_i$ that can be determined using OMP with constrained sparsity similar to testing relationship (17) above, where $$x_i^* = \min\|Py1_i - PDx_i\|_{l_2}^2 \text{ subject to } \|x_i\|_{l_0} \leq s_0 \tag{18}$$

though reconstruction of compliant pattern(s) $y1_i$ and/or candidate pattern(s) $y2_i$ can be limited and/or inaccurate. Thus, embodiments employing compressive sensing in dictionary learning can detect novelty, but not necessarily be able to reconstruct compliant pattern(s) $y1_i$ and/or candidate pattern(s) $y2_i$. Where compressive sensing or sampling is used in dictionary learning, it should also be used in testing. It should additionally be clear that while OMP is described as a technique that can be employed, and that sparsity can be constrained, any suitable technique and/or constraint can be used.

An additional application of projections can be used during dictionary learning and/or updating to further improve computational efficiency. More particularly, a variant of K-SVD known as Coupled K-SVD can be used, such as to simultaneously learn dictionary D and determine the at least one sparse coefficient $x_i$, as suggested in block 316 of FIG. 4. In Coupled K-SVD, a first residual E1 can be expressed as E1=Y1−DX, and a second residual can be expressed as E2=M−PDX, where M is a sensing matrix obtained by taking a projection through the compliant layout Y1 such that M=PY1. The first residual E1 represents reconstruction error using the whole compliant layout Y1, while the second residual E2 represents reconstruction error resulting from taking a projection through the compliant layout and the reconstructed compliant layout. The Coupled K-SVD can be implemented using $$\min_{D,X}\{\alpha\|Y1-DX\|_F^2+\|M-PDX\|_F^2\} \text{ subject to} \\ \forall_i\|x_i\|_{l_0}\leq s_0 \quad (19)$$

or $$\min_{D,X}\{\alpha\|E1\|_F^2+\|E2\|_F^2\} \text{ subject to } \forall_i\|x_i\|_{l_0}\leq s_0 \quad (19a)$$

where α is a constant that can be used to adjust an acceptable reconstruction error. The Coupled K-SVD problem in (19) and (19a) can be solved in a number of ways as should be clear to those skilled in the art. Such solutions are discussed, for example, in "Learning to Sense Sparse Signals: Simultaneous Sensing Matrix and Sparsifying Dictionary Optimization," Duarte-Carvajalino and Sapiro, IMA Preprint Series #2211, May 2008, which is incorporated by reference in its entirety. Note that in (17) above, and keeping (19) and (19a) in mind, it can be said that projections can be used to test candidate patterns by assessing the reconstruction error represented by the second residual E2=∥M−PDX∥, in which M=PY2, rather than the full ∥Y2−DX∥, which can result in still further computational savings.

For very large pattern libraries with sufficient sparsity, therefore, embodiments can offer significant performance advantages by avoiding direct distance-based matching on large feature sets and/or by exploiting recent developments in sparse representation and signal estimation theory to reduce the number of coefficients required to represent data. In terms of cost or computational complexity, training according to embodiments can be proportional to $O(N \cdot s \cdot K^2 \cdot d)$ as opposed to $O(Nd)$, but testing according to embodiments, particularly embodiments in which projections are employed, can be $O(s \cdot K \cdot m)$, where s is sparsity level, K is dictionary size, and m is a number of measurements and/or projections used in testing. Sparsity s can generally be a relatively small integer, K can generally be smaller than N, but larger than d, and m can generally be much smaller than d. The assessment overall can thus be significantly faster since computation required for assessment of each candidate pattern can be reduced by many orders of magnitude.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device design layout assessment method comprising:
   determining at least one candidate sparse coefficient for each of at least one candidate pattern;
   reconstructing, by using a computer, each candidate pattern using a sparse pattern dictionary D and the respective at least one candidate sparse coefficient to obtain a reconstructed candidate pattern, the sparse pattern dictionary D including a respective atom $d_k$ representing at least part of each of at least one compliant pattern $y1_i$ known to comply with at least one feasibility parameter;
   determining a candidate reconstruction error for each reconstructed candidate pattern $y2_i$, the candidate reconstruction error being equal to the difference between each reconstructed candidate pattern and the respective candidate pattern; and
   flagging a candidate pattern responsive to at least one of a respective candidate reconstruction error exceeding a predefined maximum candidate reconstruction error value $\epsilon_{i_{max}}$ or a candidate pattern sparsity s of a reconstructed candidate coefficient vector $x_i^*$ exceeding a predefined sparsity level $s_0$ as determined using the relationship:

$$x_i^* = \min\|y2_i - Dx_i\|_{l_2} \text{ subject to } \|x_i\|_{l_0} \leq s_0,$$

wherein the flagging of a candidate pattern includes flagging each candidate pattern for which the candidate reconstruction error exceeds a largest learning reconstruction error determined using the relationship:

$$\epsilon_i > C_{adj} * \max\|y1_i - Dx_i\|_{l_2},$$

where $C_{adj}$ is a predefined adjustment constant whose value determines how different a candidate pattern $y2_i$ has to be from the at least one compliant pattern $y1_i$ to be flagged.

2. The method of claim 1, further comprising building the sparse pattern dictionary D, including providing at least one compliant layout Y1, each compliant layout Y1 including the at least one compliant pattern $y1_i$, and acquiring the at least one compliant pattern $y1_i$ by scanning each compliant layout Y1 with a window of a learning resolution d.

3. The method of claim 2, further comprising determining the at least one compliant sparse coefficient by applying matching pursuit to each compliant pattern $y1_i$ and iterating between at least one sparsity solution and at least one error reconstruction solution until a learning reconstruction error $\epsilon_i$ reaches a threshold learning error value $\epsilon_0$.

4. The method of claim 3, further comprising determining the learning reconstruction error $\epsilon_i$ using $l_2$-norm minimization in the relationship $\epsilon_i = \|y1_i - Dx_i\|_{l_2}$, where $x_i$ represents a vector including the respective at least one compliant sparse coefficient of the $i^{th}$ compliant pattern being learned, the at least one sparsity solution includes holding D constant, and the at least one error reconstruction solution includes holding $x_i$ constant.

5. The method of claim 4, further comprising acquiring a desired sparsity level $s_0$, wherein the compliant layout includes N compliant patterns of at least one dimension d such that $y1_i$, i=1, N in $\{0,1\}^d$, and the applying of the matching pursuit includes employing the relationship $$\min\|y1_i - Dx_i\|_{l_2} \text{ subject to } \|x_i\|_{l_0} \leq s_0$$

executed using $l_2$-norm minimization of the learning error reconstruction term $\|y1_i - Dx_i\|_{l_2}$ and $l_0$-norm minimization of the compliant coefficient vector $x_i$.

6. The method of claim 4, further comprising adding a respective additional atom $d_k$ for each of at least one additional compliant pattern $y1_i$ to the sparse pattern dictionary D using the relationship $$d_k = \arg\min \left\| Y1 - \sum_{j \neq k} d_j x_j - d_k x_k \right\|_F$$

where $\Sigma_{j \neq k} d_j x_j$ is a matrix constructed using the sparse pattern dictionary D without the additional atom, $d_k x_k$, is a contribution resulting from using the additional atom $d_k$ and a respective $k^{th}$ row of sparse coefficient matrix X, and the operation includes a Frobenius norm defined as, for an m×n matrix A, $$\|A\|_F = \sqrt{\sum_{j=1}^{m} \sum_{k=1}^{n} |a_{i,j}|^2}.$$

7. The method of claim 1, further comprising providing at least one candidate layout Y2, and acquiring the at least one candidate pattern $y2_i$ by scanning each candidate layout Y2 with a window of a testing resolution d.

8. The method of claim 7, further comprising performing signal recovery for each candidate pattern $y2_i$, including minimizing candidate reconstruction error $\epsilon_i = \|y2_i - Dx_i\|_{l_2}$ while constraining sparsity of the at least one candidate sparse coefficient $x_i$ using the predefined sparsity level $s_0$.

9. The method of claim 8, wherein the performing of the signal recovery includes determining the at least one respective candidate sparse coefficient $x_i$ using matching pursuit and the relationship $$\min\|y2_i - Dx_i\|_{l_2} \text{ subject to } \|x_i\|_{l_o} \leq s_0$$

executed using $l_2$-norm minimization of the candidate reconstruction error term $\|y2_i - Dx_i\|_{l_2}$ and the $l_0$-norm of the at least one candidate sparse coefficient $x_i$, wherein the candidate layout Y2 includes N candidate patterns $y2_i$ of at least one dimension d such that $y2_i$, $i=1, \ldots N$ in $\{0,1\}^d$.

10. The method of claim 1, wherein the reconstructing of each candidate pattern $y2_i$ includes employing matching pursuit and the relationship $$x_i^* = \min\|x_i\|_{l_o} \text{ subject to } \|y2_i - Dx_i\|_{l_2} \leq s_{i_{max}}.$$

where $y2_i$ represents the $i^{th}$ candidate pattern being assessed from a candidate layout Y2, $x_i$ represents a vector including the respective at least one candidate sparse coefficient of the $i^{th}$ candidate pattern, and $x_i^*$ represents a reconstructed candidate sparse coefficient vector.

11. The method of claim 1, further comprising modifying a candidate pattern based on reducing the candidate reconstruction error to increase a respective feasibility of fabrication.

12. The method of claim 1, further comprising taking a projection P through the at least one compliant pattern $y1_i$ by taking the projection through the respective compliant layout Y1, and using a matrix X including the at least one compliant sparse coefficient and the projection in the acquiring of the sparse pattern dictionary D with $$\min_{D,X}\{\alpha\|Y1 - DX\|_F^2 + \|M - PDX\|_F^2\} \text{ subject to } \forall_i \|x_i\|_{l_o} \leq s_0,$$

in which $\alpha$ is a constant that can be used to adjust an acceptable reconstruction error, M is a sensing matrix obtained by taking a projection through the compliant layout Y1 such that M=PY1.

13. A computer program product stored on a non-transitory computer readable storage medium in the form of computer executable code including instructions that, when executed by a computing device, configure the computing device to:

determine at least one candidate sparse coefficient for each of at least one candidate pattern;

reconstruct each candidate pattern using a sparse pattern dictionary D and the respective at least one candidate sparse coefficient to obtain a reconstructed candidate pattern, the sparse pattern dictionary D including at least one respective atom $d_k$ representing at least part of a respective compliant pattern $y1_i$ known to comply with at least one feasibility parameter;

determine a candidate reconstruction error $\epsilon_i$ for each reconstructed candidate pattern $y2_i$, the candidate reconstruction error being equal to the difference between each reconstructed candidate pattern and the respective candidate pattern; and flag a candidate pattern responsive to at least one of a respective candidate reconstruction error $\epsilon_i$ exceeding a predefined maximum candidate reconstruction error value $\epsilon_{i_{max}}$ or a candidate sparse coefficient sparsity s of a reconstructed candidate coefficient vector $x_i^*$ exceeding a predefined sparsity level $s_0$ as determined using the relationship:

$$x_i^* = \min\|y2_i - Dx_i\|_{l_2} \text{ subject to } \|x_i\|_{l_o} \leq s_0,$$

wherein the flagging of a candidate pattern includes flagging each candidate pattern for which the candidate reconstruction error exceeds a largest learning reconstruction error determined using the relationship:

$$\epsilon_i > C_{adj} * \max\|y1_i - Dx_i\|_{l_2},$$

where $C_{adj}$ is a predefined adjustment constant whose value determines how different a candidate pattern $y2_i$ has to be from the at least one compliant pattern $y1_i$ to be flagged.

14. The computer program product of claim 13, wherein the instructions further configure the computing device to acquire a desired sparsity level $s_0$, to build the sparse pattern dictionary D by scanning at least one compliant layout Y1 of N compliant patterns $y1_i$ with a window of a learning resolution d such that $y1_i$, $i=1, \ldots N$ in $\{0,1\}^d$, and determining at least one compliant sparse coefficient by applying matching pursuit employing the relationship $$\min\|y1_i - Dx_i\|_{l_2} \text{ subject to } \|x_i\|_{l_o} \leq s_0$$

wherein $x_i$ represents a vector including the respective at least one compliant sparse coefficient of the $i^{th}$ compliant pattern being learned and that is executed using $l_2$-norm minimization of the learning error reconstruction term $\epsilon_i = \|y1_i - Dx_i\|_{l_2}$ and the $l_0$-norm of the respective compliant coefficient vector $x_i$ of each compliant pattern $y1_i$, by iterating between holding D constant and holding $x_i$ constant until sparsity s of the respective compliant sparse coefficient vector $x_i$ as determined using $\|x_i\|_{l_o}$ is no more than the predefined sparsity level $s_0$.

15. The computer program product of claim 14, wherein the instructions further configure the computing device to add a respective additional atom $d_k$ for each of at least one additional compliant pattern $y1_i$ to the sparse pattern dictionary D using the relationship $$d_k = \arg\min \left\| Y1 - \sum_{j \ne k} d_j x_j - d_k x_k \right\|_F$$

where $\Sigma_{j \ne k} d_j x_j$ is a matrix constructed using the sparse pattern dictionary without the additional atom, $d_k x_k$ is a vector constructed using the additional atom $d_k$ and a respective $k^{th}$ row of sparse coefficient matrix X, and the operation includes a Frobenius norm defined as, for an m×n matrix A, $$\|A\|_F = \sqrt{\sum_{j=1}^{m} \sum_{k=1}^{n} |a_{i,j}|^2} \ .$$

16. The computer program product of claim 13, wherein the instructions further configure the computing device to acquire a desired sparsity level $s_0$, to acquire the at least one candidate pattern by scanning at least one candidate layout Y2 of N candidate patterns $y2_i$ with a window of a testing resolution d such that $y2_i$, i=1, N in $\{0,1\}^d$, and to determine the at least one candidate sparse coefficient using matching pursuit and the relationship $$\min \|y2_i - Dx_i\|_{l_2} \text{ subject to } \|x_i\|_{l_o} \le s_0$$

wherein $x_i$ represents a candidate coefficient vector including the respective at least one candidate sparse coefficient of the $i^{th}$ candidate pattern being assessed and that is executed using $l_2$-norm minimization of the candidate reconstruction error term $\epsilon_i = \|y2_i - Dx_i\|_{l_2}$, and a sparsity s of the respective candidate coefficient vector $x_i$ is determined using $l_0$-norm minimization of the candidate coefficient vector $x_i$.

17. The computer program product of claim 13, wherein the flagging of a candidate pattern includes flagging each candidate pattern $y2_i$ for which the candidate reconstruction error $\epsilon_i = \|y2_i - Dx_i\|_{l_2}$ exceeds a largest learning reconstruction error determined using the relationship $$\epsilon_i > C_{adj} * \max \|y1_i - Dx_i\|_{l_2},$$

where $C_{adj}$ is a predefined adjustment constant whose value determines how different a candidate pattern $y2_i$ has to be from the at least one compliant pattern $y1_i$ to be flagged.

18. A semiconductor device design layout assessment system including:
   a sparse pattern dictionary D including a respective atom $d_k$ that is a respective representation of at least part of at least one compliant pattern $y1_i$ from at least one compliant layout Y1, each atom $d_k$ including at least one compliant basis function of the respective compliant pattern $y1_i$; and
   a computing device including a processor, the computing device being communicatively coupled to the sparse pattern dictionary and configured to:
   determine a respective at least one candidate sparse coefficient $x_i$ for each of at least one candidate pattern $y2_i$;
   create a reconstructed candidate pattern $Dx_i$ based on the sparse pattern dictionary D and the respective at least one candidate sparse coefficient $x_i$;
   determine a respective candidate reconstruction error $\epsilon_i$ between each candidate pattern $y2_i$ and the respective reconstructed candidate pattern $Dx_i$; and
   flag a candidate pattern responsive to at least one of a respective candidate reconstruction error $\epsilon_i \|y2_i - Dx_i\|_{l_2}$ exceeding a largest learning reconstruction error $\|y1_i - Dx_i\|_{l_2}$ including the relationship:

$$\epsilon_i > C_{adj} * \max \|y1_i - Dx_i\|_{l_2},$$

where $C_{adj}$ is a predefined adjustment constant whose value determines how different a candidate pattern $y2_i$ has to be from the at least one compliant pattern $y1_i$ to be flagged,
   or a sparsity s of a reconstructed candidate coefficient vector $x_i^*$ exceeding a predefined sparsity level $s_0$ as determined using the relationship:

$$x_i^* = \min \|y2_i - Dx_i\|_{l_2} \text{ subject to } \|x_i\|_{l_o} \le s_0.$$

19. The system of claim 18, wherein the computing device is further configured to determine the respective at least one candidate sparse coefficient $x_i$ by acquiring the predefined sparsity level $s_0$, and employing matching pursuit and the relationship $$\min \|y2_i - Dx_i\|_{l_2} \text{ subject to } \|x_i\|_{l_o} \le s_O,$$

executed using $l_2$-norm minimization of the learning error reconstruction term $\epsilon_i \|y2_i - Dx_i\|_{l_2}$ and the $l_0$-norm of the candidate coefficient vector $x_i$.

* * * * *